(12) United States Patent
Yang et al.

(10) Patent No.: US 9,529,020 B2
(45) Date of Patent: Dec. 27, 2016

(54) CIRCUIT AND METHOD FOR SENSING A DIFFERENTIAL CAPACITANCE

(71) Applicant: ELAN MICROELECTRONICS CORP., Hsinchu (TW)

(72) Inventors: Chao-Chi Yang, Hsinchu (TW); Shih-How Peng, Hsinchu (TW)

(73) Assignee: ELAN MICROELECTRONICS CORPORATION, Hsinchu (TW)

( * ) Notice: Subject to any disclaimer, the term of this patent is extended or adjusted under 35 U.S.C. 154(b) by 119 days.

(21) Appl. No.: 14/657,621

(22) Filed: Mar. 13, 2015

(65) Prior Publication Data

US 2015/0185257 A1 Jul. 2, 2015

Related U.S. Application Data

(62) Division of application No. 13/457,096, filed on Apr. 26, 2012, now Pat. No. 9,007,074.

(30) Foreign Application Priority Data

Apr. 29, 2011 (TW) .............................. 100115139 A

(51) Int. Cl.
*G01R 27/26* (2006.01)
*G01R 17/02* (2006.01)
*G01D 5/24* (2006.01)

(52) U.S. Cl.
CPC ................. *G01R 17/02* (2013.01); *G01D 5/24* (2013.01)

(58) Field of Classification Search
CPC ............................ G01R 27/2605; G01R 17/02
USPC ........................................ 324/679, 681, 683
See application file for complete search history.

(56) References Cited

U.S. PATENT DOCUMENTS

| | | | |
|---|---|---|---|
| 4,375,595 | A | 3/1983 | Ulmer et al. |
| 5,977,803 | A | 11/1999 | Tsugai |
| 6,366,099 | B1 | 4/2002 | Reddi |
| 6,492,911 | B1 | 12/2002 | Netzer |
| 6,949,937 | B2 | 9/2005 | Knoedgen |
| 7,289,054 | B1 | 10/2007 | Watanabe et al. |
| 7,323,886 | B2 | 1/2008 | Lee |
| 2005/0134292 | A1 | 6/2005 | Knoedgen et al. |

FOREIGN PATENT DOCUMENTS

| | | |
|---|---|---|
| TW | 200915713 A | 4/2009 |
| TW | I393040 B1 | 9/2010 |

*Primary Examiner* — Vincent Q Nguyen
(74) *Attorney, Agent, or Firm* — Muncy, Geissler, Olds & Lowe, P.C.

(57) ABSTRACT

A circuit and a method for sensing differential capacitance involve using plural storing capacitors to repeatedly sample charges of the differential capacitance in an over-sampling manner, and storing the charges sampled in different transfer rounds into different storing capacitors instead of repeatedly transferring charges for a single storing capacitor, so as to collect charge averages about both inputs and noises and in turn effectively reduce RF interference and source noises.

8 Claims, 11 Drawing Sheets

CIRCUIT AND METHOD FOR SENSING A DIFFERENTIAL CAPACITANCE

This application is a divisional application of U.S. patent application Ser. No. 13/457,096, filed on Apr. 26, 2012, now U.S. Pat. No. 9,007,074, the content of which is incorporated herein by reference in its entirety.

FIELD OF THE INVENTION

The present invention is related generally to a circuit for sensing differential capacitance and, more particularly, to a circuit and a method for sensing differential capacitance capable of reducing RF interference and source noises.

BACKGROUND OF THE INVENTION

Differential capacitance is also referred to as electrode capacitance, which is a difference between the capacitances formed at two electrodes. Sensors working thereupon have been developed and extensively used for sensing capacitive variations caused by physical factors, such as pressures, acceleration, linear displacement and rotational angles. While the circuit layouts may vary with practical sensing requirements, such sensors generally produce the sensing value according to the difference between the individual capacitances of two electrodes therein.

U.S. Pat. No. 6,949,937 has proposed a sensing circuit as depicted in FIG. 1, which comprises a switched capacitor front-end 12 and an amplifier stage 14. A differential capacitance 10 is a capacitance between two electrodes and may be regarded as a combination of a pair of variable capacitors CT1 and CT2. The switched capacitor front-end 12 that includes a switching circuit 16 and a charge-storing circuit 18 is connected to the capacitors CT1 and CT2 at sensing terminals Input1 and Input2, respectively. By switching switches S1-S8 in the switching circuit 16, the capacitors CT1 and CT2 are connected to power sources VDD and VSS for supplying charges as desired. Then the charges of the capacitors CT1 and CT2 are repeatedly transferred to the capacitors C1 and C2 in the charge-storing circuit 18. Afterward, the charges of the capacitors C1 and C2 are stored into two terminals of a floating capacitor CD, so that the potential difference VCD between the two terminals of the capacitor CD corresponds to the difference between the capacitors CT1 and CT2. At last, the two terminals of the capacitor CD are connected to the inputs of the amplifier 14, so that the amplifier stage 14 amplifies and then outputs the potential difference VCD, thereby accomplishing measurement of the differential capacitance 10. FIGS. 2A-2E illustrate operation of the switched capacitor front-end 12 of FIG. 1. The known technique repeats the operation as shown in FIGS. 2A-2D in an over-sampling manner without resetting switches SR1 and SR2, thereby repeatedly charging and discharging the capacitors CT1 and CT2, and repeatedly transferring the charges to the individual storing capacitor C1 or C2 inside the charge-storing circuit 18, so as to collect charge averages within the switched capacitor front-end 12 and in turn suppress RF interference or source noises. Afterward, as shown in FIG. 2E, the charges of the capacitors C1 and C2 are stored to the two terminals of the capacitor CD, and then amplified and output by the amplifier stage 14 that is at the back-end part of FIG. 1 and connected to the two terminals of the capacitor CD. Since the known technique collects charge averages by repeatedly operating only the switched capacitor front-end 12 in the front-end part for averaging instead of repeatedly operating the entire circuit, it helps to reduce power loss.

However, such an existing approach is not effective enough in noise reduction. Taking the capacitor C1 for example, according to the law of charge conservation, the output voltage after n rounds of charge transfer is determined as $$V_{OUT1} = V_n + V_{n-1} \cdot X + V_{n-2} \cdot X^2 + \cdots + V_1 \cdot X^{n-1}, \quad [\text{Eq-1}]$$

$$X = \frac{C1}{CT1 + CT2 + C1}, \quad [\text{Eq-2}]$$

$$V_{i,i=1 \cdots n} = VDD_i \times \frac{CT1}{CT1 + CT2 + C1}, \quad [\text{Eq-3}]$$

where X is typically between 0.1 and 0.5, and VDDi may be regarded as incorporating RF interference and source noises while the equivalent source VDD varies over time. According to the equations Eq-1, Eq-2 and Eq-3, after n rounds of sampling and transfer, all the results are affected by the factor X except for the result of the nth rounds. Since X<1, the earlier result affects the final output less. In other words, VOUT1 approximates Vn, so the over-sampling operation under this configuration fails to effectively average charges and reduce noises.

In addition, the amplifier stage 14 uses the operational amplifier to directly amplify the difference VCD between the corresponding output voltages VOUT1 and VOUT2, so the non-ideal effects of the operational amplifier (e.g. offsets, flicker noise and finite gain error) are output through the output terminal as well, making the sensing performance deteriorated.

SUMMARY OF THE INVENTION

An objective of the present invention is to provide a circuit and a method for sensing differential capacitance capable of reducing RF interference and source noises.

According to the present invention, a circuit for sensing a differential capacitance comprises first and second sensing terminals connected to two terminals of a differential capacitance, a switching circuit connected to the first and second sensing terminals for being switched to make two terminals of the differential capacitance get connected to a high-voltage source or a low-voltage source or perform charge transfer, a charge-storing circuit coupled to the switching circuit, the charge-storing circuit storing charges transferred by the differential capacitance in response to the switch of the switching circuit, the charge-storing circuit comprising a first storing circuit including a plurality of first storing capacitors, for storing charges sampled at one of the terminals of the differential capacitance in different transfer rounds into the different first storing capacitors, and a second storing circuit including a plurality of second storing capacitors, for storing charges sampled at the other terminal of the differential capacitance in the different transfer rounds into the different second storing capacitors, so as to generate a second output voltage, and an amplifier stage for generating a sensing value according to a difference between the first and second output voltages.

According to the present invention, a method for sensing a differential capacitance comprises steps of switching a switch to make two terminals of the differential capacitance get connected to a high-voltage source or a low-voltage source or perform charge transfer, storing charges sampled at one of the terminals of the differential capacitance in different transfer rounds into different first storing capacitors, so as to generate a first output voltage, storing charges sampled at the other terminal of the differential capacitance in the different transfer rounds into different second storing capacitors, so as to generate a second output voltage, and generating a sensing value according to a difference between the first and second output voltages.

According to the present invention, a circuit for sensing a differential capacitance comprises a first sensing terminal and a second sensing terminal connected to two terminals of the differential capacitance, a switching circuit connected to the first and second sensing terminals, for being switched to make the two terminals of the differential capacitance connected to a high-voltage source or a low-voltage source or to transfer charges, a charge-storing circuit coupled to the switching circuit, the charge-storing circuit storing charges transferred by the differential capacitance in response to the switch of the switching circuit, the charge-storing circuit comprising a first storing circuit storing charges sampled at one of the terminals of the differential capacitance into a first storing capacitor, a second storing circuit storing charges sampled at the other terminal of the differential capacitance into a second storing capacitor, and a third storing circuit including a plurality of third storing capacitors, each said third storing capacitor having two terminals connected to the first and second storing circuits, respectively, for storing charges in the first and second storing circuits into different said third storing capacitors, wherein when the plural third storing capacitors are connected in parallel as an assembly, a first output voltage and a second output voltage are generated at two terminals of the assembly, and an amplifier stage generating a sensing value according to a difference between the first and second output voltages.

According to the present invention, a method for sensing a differential capacitance comprises steps of switching a switch to make two terminals of the differential capacitance get connected to a high-voltage source or a low-voltage source or perform in charge transfer, storing charges sampled at one of the terminals of the differential capacitance into a first storing capacitor, storing charges sampled at the other terminal of the differential capacitance into a second storing capacitor, storing charges in the first and second storing circuits in different transfer rounds into different third storing capacitors, and connecting the third storing capacitors in parallel as an assembly so that a first output voltage and a second output voltage are generated at two terminals of the assembly, and generating a sensing value according to a difference between the first and second output voltages.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Not repeatedly transferring charges in a single storing capacitor, the present invention instead implements multiple internal storing capacitors for oversampling, so as to collect charge averages from inputs and noises, thereby effectively reducing RF interference and source noises.

Figure 2A:
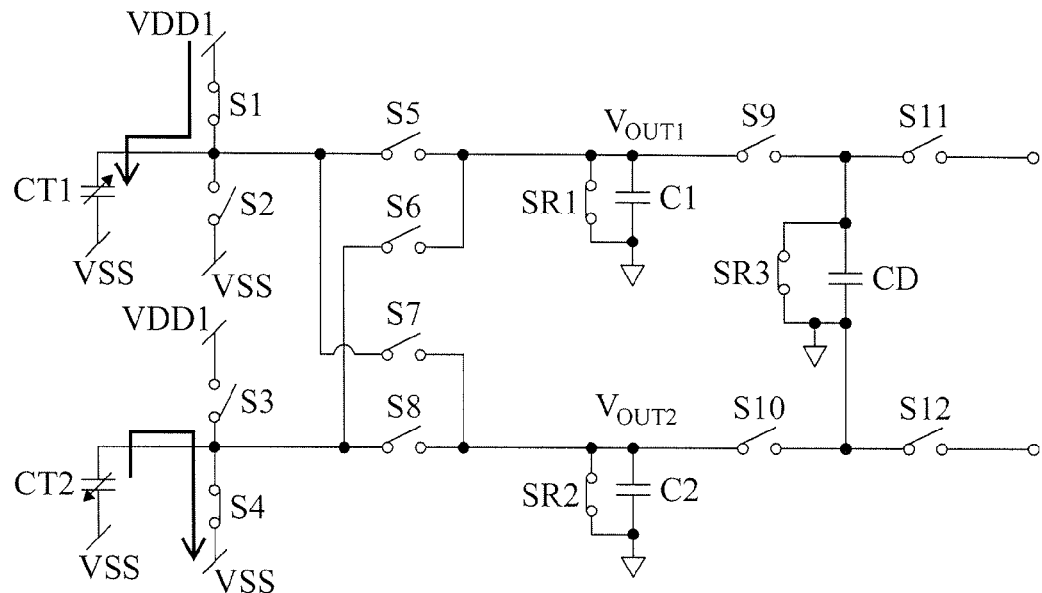
FIGS. 2A-2E illustrate operation of a switched capacitor front-end of FIG. 1.
Figure 2B:
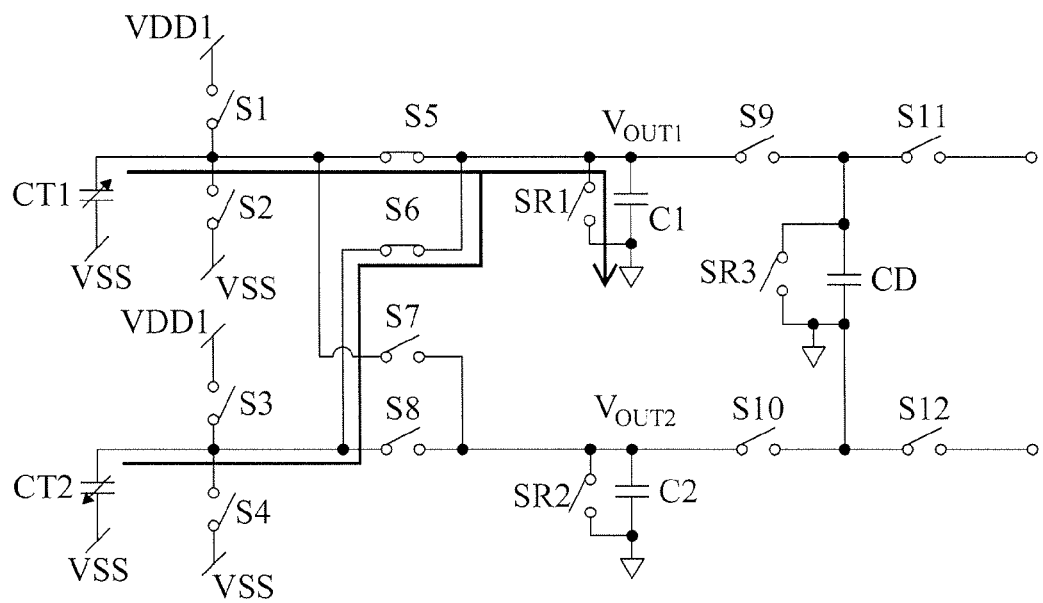
Figure 2C:
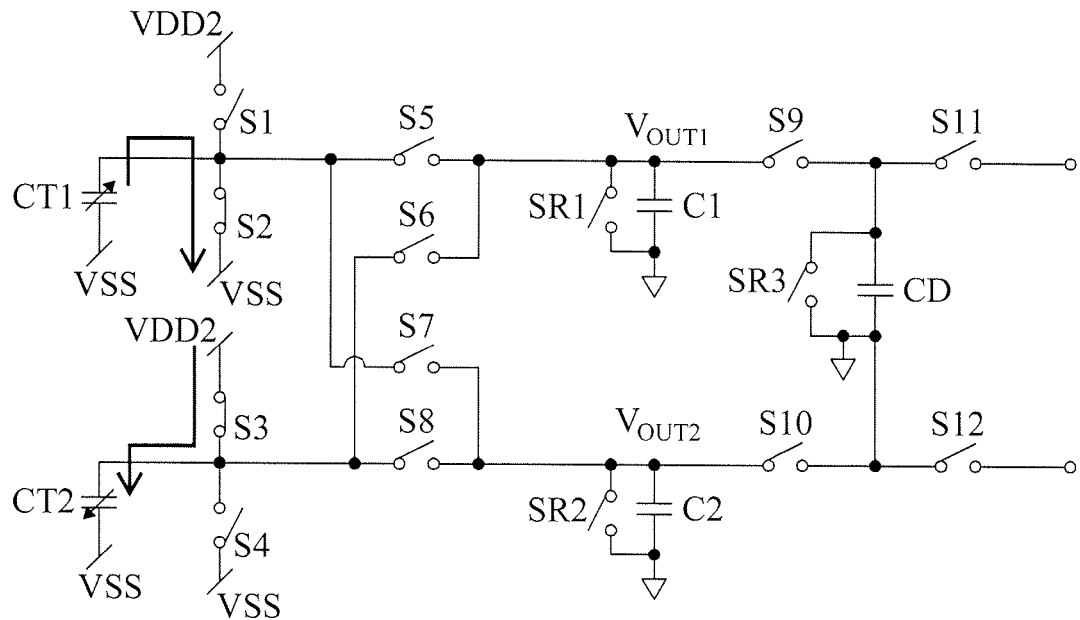
Figure 2D:
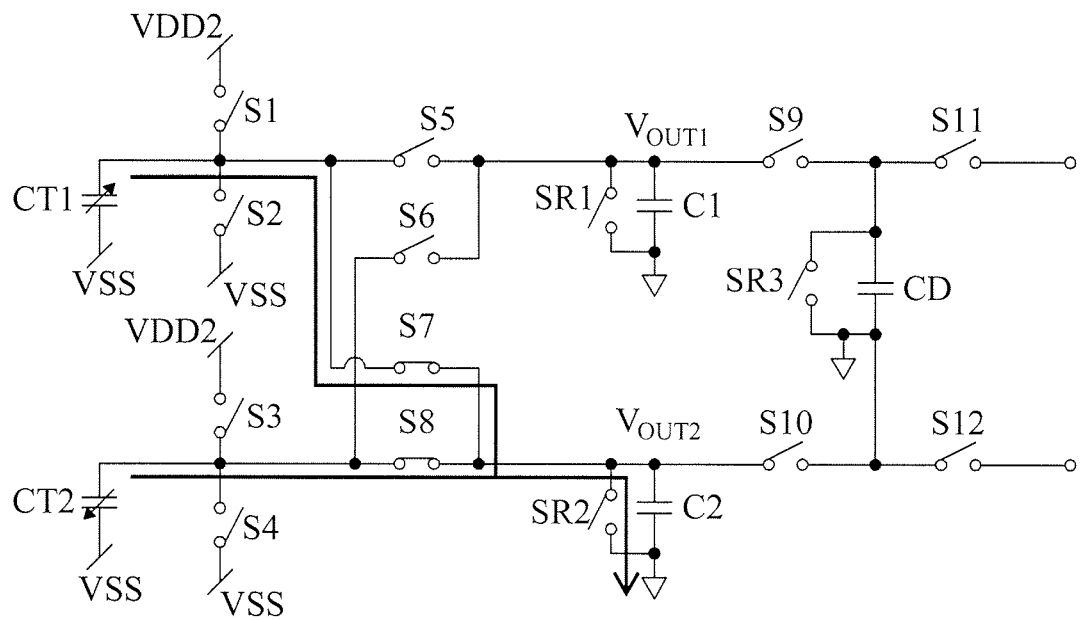
Figure 2E:
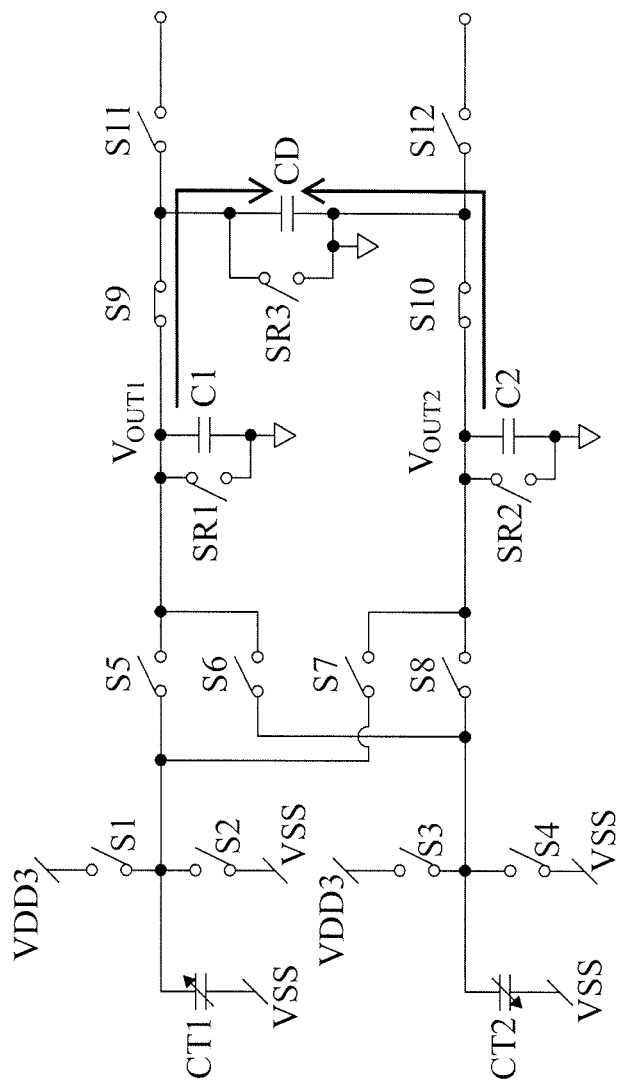
Figure 3:
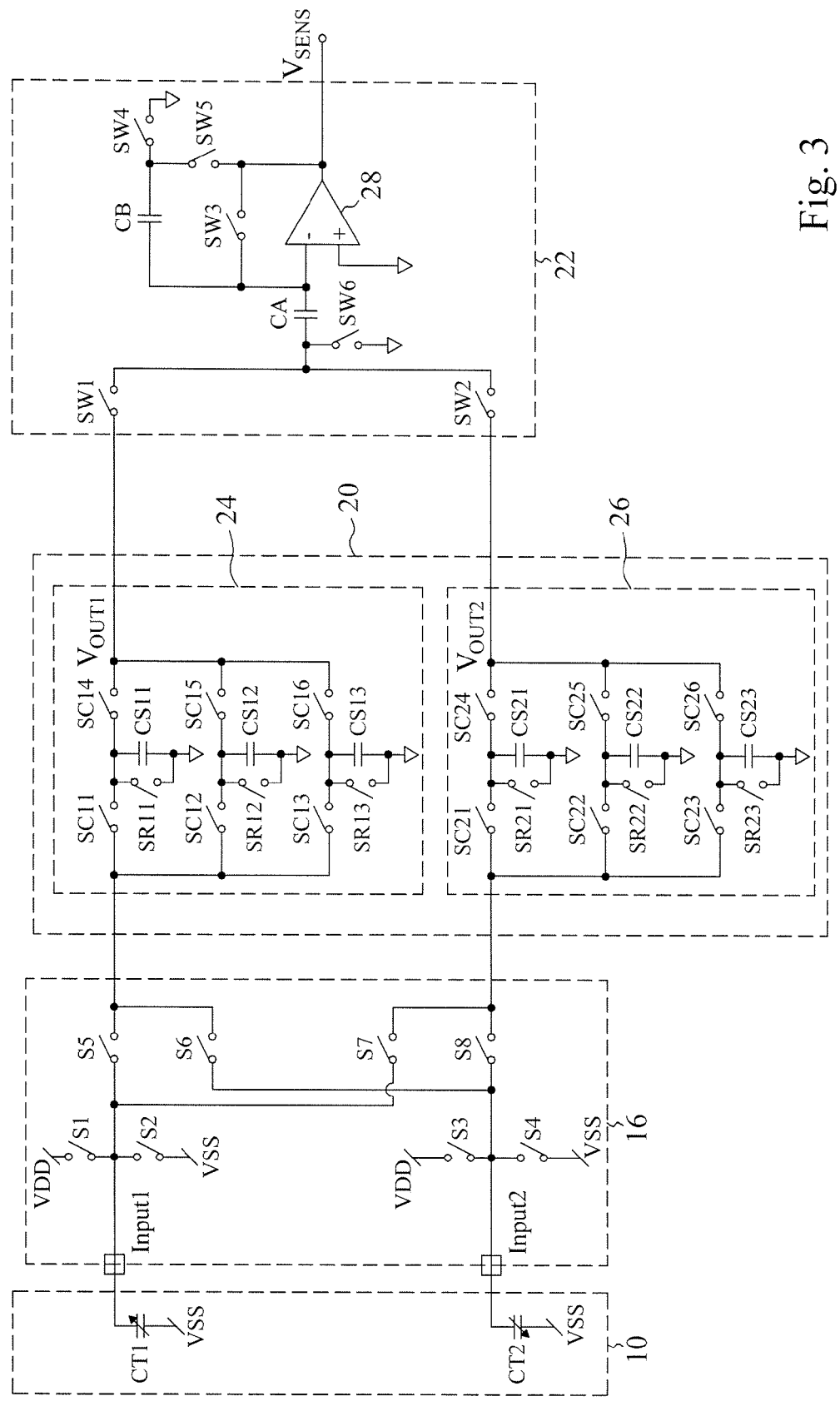
FIG. 3 is a first embodiment of a circuit for sensing a differential capacitance according to the present invention.
Figure 4A:
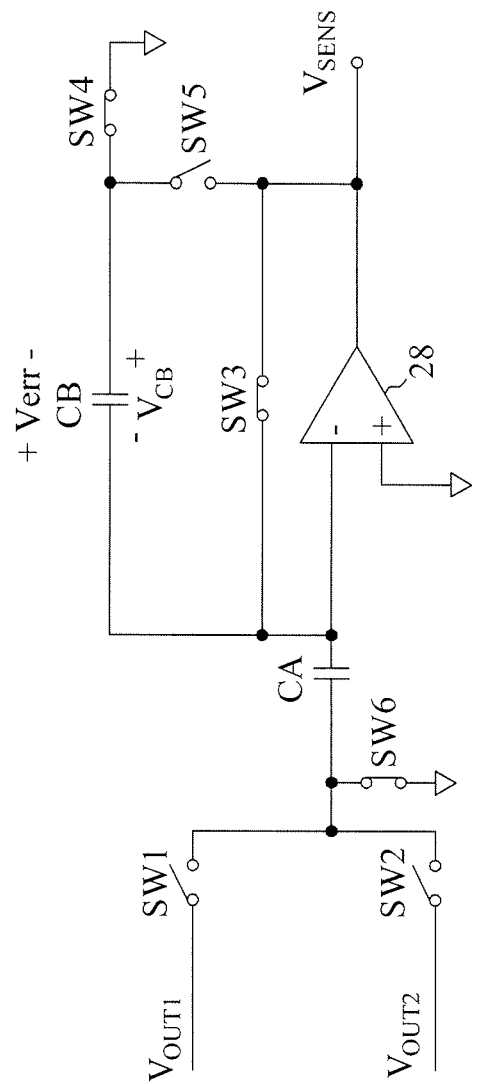
FIGS. 4A-4C illustrate operation of an amplifier stage of FIG. 3.
Figure 4B:
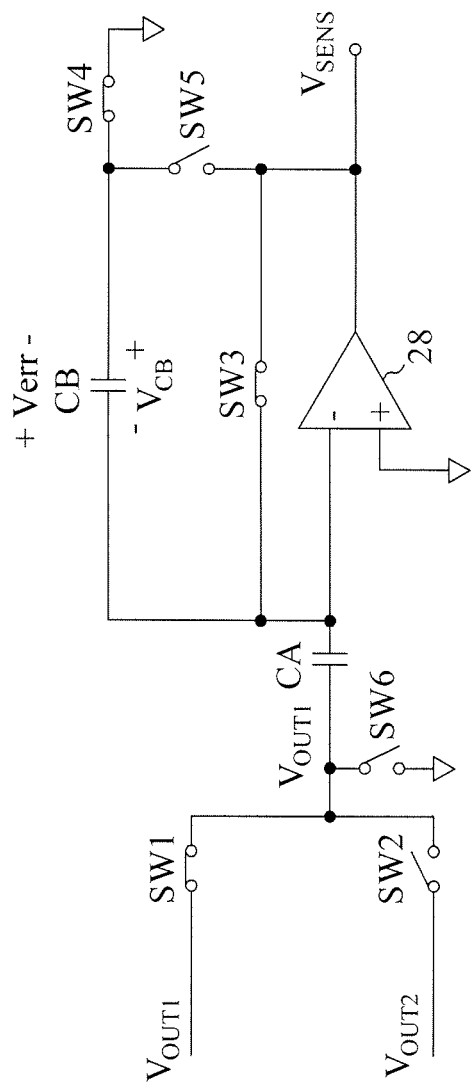
Figure 4C:
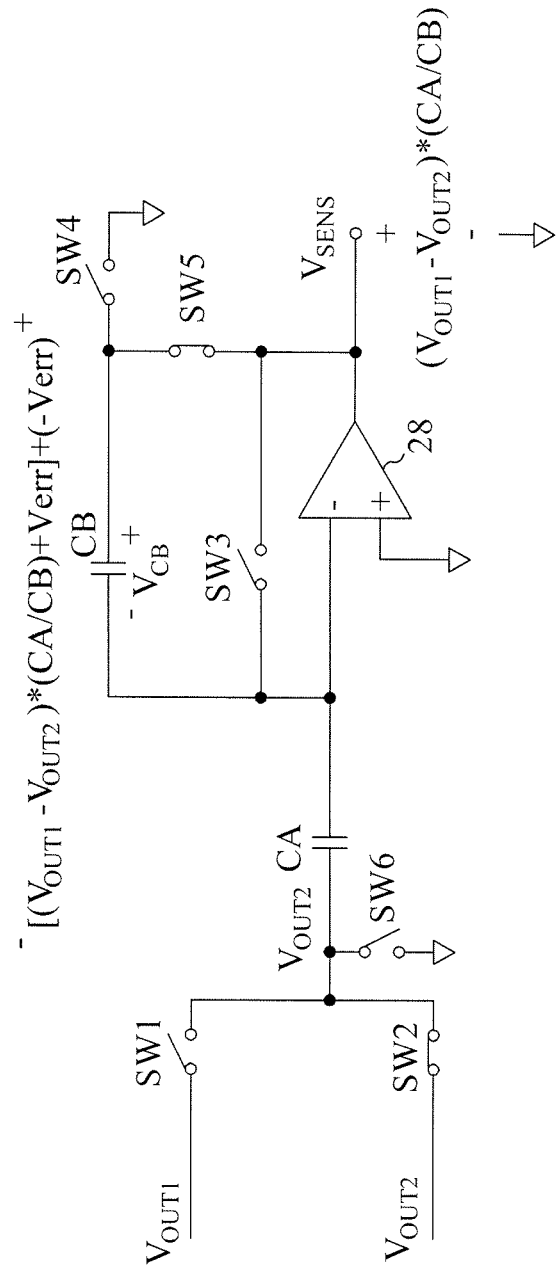

FIG. 3 is a first embodiment of a circuit for sensing a differential capacitance according to the present invention. The circuit has a switching circuit 16, a charge-storing circuit 20 and an amplifier stage 22. The charge-storing circuit 20 includes a plurality of storing capacitors. During operation, it uses switches to make the charges sampled in each transfer round stored into a different storing capacitor, and then connects all the storing capacitors in parallel for outputting, so as to collect charge averages from both inputs and the noises. The switching circuit 16 is connected to capacitors CT1 and CT2 at sensing terminals Input1 and Input2, respectively. By switching switches S1-S8 in the switching circuit 16, the capacitors CT1 and CT2 are connected to a low-voltage source or a high-voltage source. Then the charges of the capacitors CT1 and CT2 are repeatedly transferred to the charge-storing circuit 20, as shown in FIGS. 2A-2D. For all the embodiments described herein, the power source VSS is referred to as the low-voltage source and the power source VDD is referred to as the high-voltage source, which supply charges as desired. The charge-storing circuit 20 has storing circuits 24 and 26 that are configured identically. The storing circuit 24 includes multiple capacitors CS11, CS12 and CS13. During operation, switches SC11, SC12 and SC13 make the charges transferred by the capacitor CT1 in different rounds into the different capacitors CS11, CS12 and CS13. At last, the switches SC14, SC15 and SC16 are turned on at the same time to connect all the capacitors CS11, CS12 and CS13 in parallel, so as to generate the output voltage VOUT1. The storing circuit 26 includes multiple capacitors CS21, CS22 and CS23. During operation, switches SC21, SC22 and SC23 make the charges transferred by the capacitor CT2 in different rounds into the different capacitors capacitor CS21, CS22 and CS23. At last, the switches SC24, SC25 and SC26 are turned on at the same time to connect all the capacitors CS11, CS12 and CS13 in parallel, so as to generate the output voltage VOUT2. In the present embodiment, the amplifier stage 22 operates based on a pseudo correlated double sampling technique to input the voltages sampled by the front-end in different transfer rounds, and then the capacitors are used to store the errors of the non-ideal characteristics so as to offset the non-ideal characteristics of the operational amplifier. The amplifier stage 22 includes an operational amplifier 28, switches SW1-SW6 and sampling capacitors CA and CB. The operational amplifier 28 has its positive input terminal connected to a common reference-voltage source. The switch SW1 is connected to the storing circuit 24 for inputting the output voltage VOUT1. The switch SW2 is connected to the storing circuit 26 for inputting the output voltage VOUT2. The switch SW3 is connected between the negative input terminal and output terminal of the operational amplifier 28. The sampling capacitor CA has one terminal connected to the negative input terminal of the operational amplifier 28, and an opposite terminal connected to the switches SW1 and SW2. The sampling capacitor CB has one terminal connected to the negative input terminal of the operational amplifier 28, and an opposite terminal connected to the switches SW4 and SW5, so that the sampling capacitor is connected to the common reference-voltage source or the output terminal of the operational amplifier 28. The switch SW6 serves to reset the sampling capacitor CA. In one embodiment, the power source VSS is used as the common reference-voltage source. In another embodiment, (VDD−VSS)/2 is used as the common reference-voltage source. FIGS. 4A-4C illustrate operation of the amplifier stage 22 of FIG. 3. At the beginning, as shown in FIG. 4A, the switch SW6 is first turned on to reset the sampling capacitor CA, and is at the same time connected to the negative input terminal of the operational amplifier 28 so as to store a non-ideal error Verr of the operational amplifier 28 into the sampling capacitor CB. Then as shown in FIG. 4B, the switches SW1 and SW4 are turned on, so that the sampling capacitor CA samples the output voltage VOUT1. At last, the switches SW2 and SW5 are turned on so as to make the sampling capacitor CB connected between the negative input terminal and output terminal of the operational amplifier 28, while the sampling capacitor CA samples the output voltage VOUT2. After amplified by the amplifier stage, the voltage drop of the sampling capacitor CB is VCB=[(VOUT1−VOUT2)×(CA/CB)+Verr]+(−Verr), where the non-ideal error Verr is neutralized by the non-ideal effect of the operational amplifier 28, so as to generate the sensing value VSENS=(VOUT1−VOUT2)×(CA/CB), which is only related to the difference between the output voltages VOUT1 and VOUT2.

Figure 5:
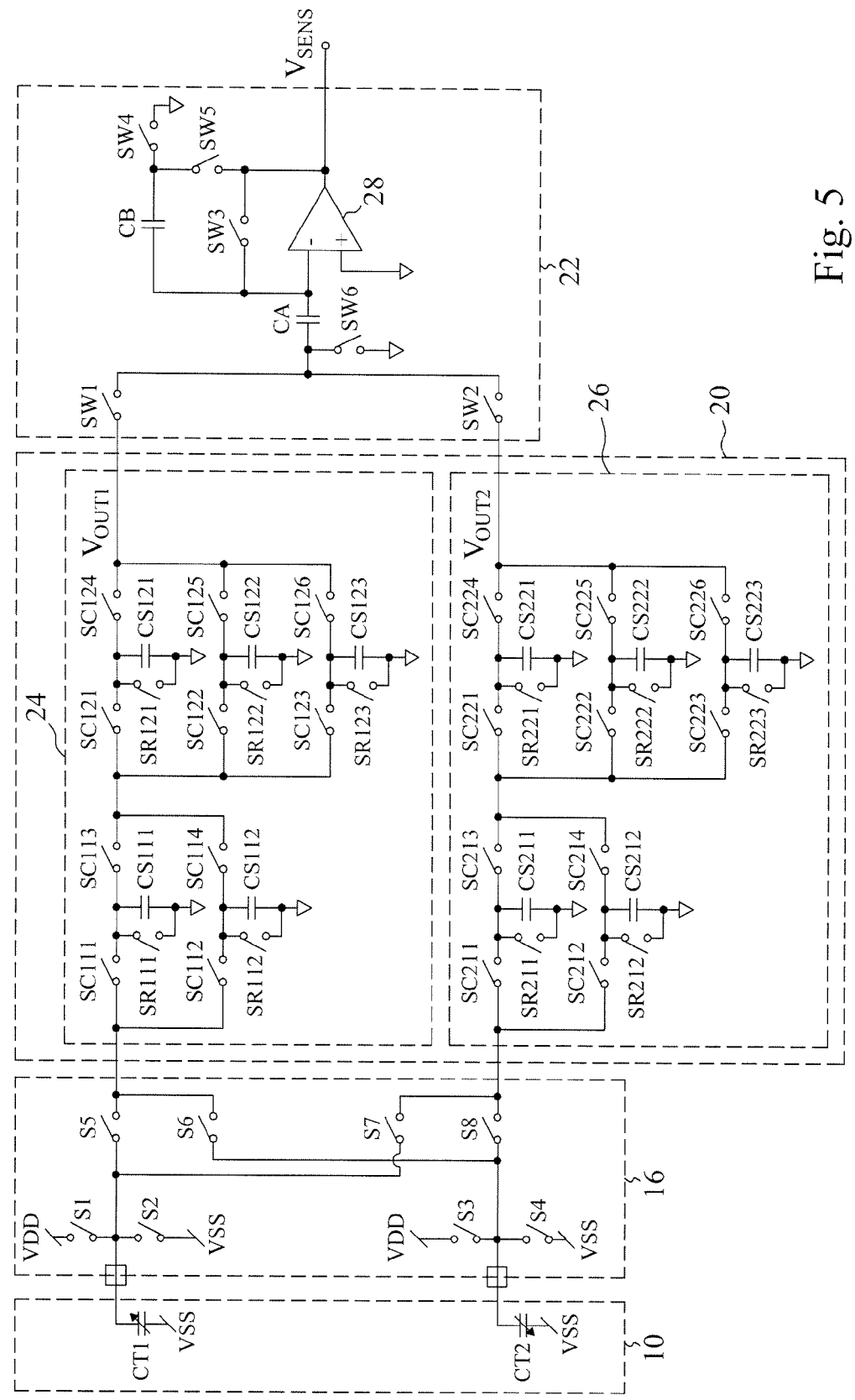
FIG. 5 is one embodiment of a charge-storing circuit using a two-tier capacitor.

For separately storing the charges sampled in different transfer rounds, the charge-storing circuit 20 may use a multi-tier storage approach. For example, as shown in FIG. 5, the charge-storing circuit 20 has two-tier configuration. Therein, storing circuits 24 and 26 are configured identically to have a two-tier storage structure. An example herein is that the storing circuit 24 repeatedly samples the capacitor CT1, as shown in FIGS. 2A-2B. The charges transferred in a first transfer round are stored into the capacitor CS111, and the charges transferred in a second transfer round are stored into the capacitor CS112. Afterward, the switches SC113 and SC114 are turned on to transfer the charges of the capacitors CS111 and CS112 to the capacitor CS121 for storage. Then the switches SR111 and SR112 are turned on to reset the capacitors CS111 and CS112. The third and fourth transfer rounds are performed in the same manner with the charges stored into the capacitor CS111 and CS112, respectively before transferred to the capacitor CS122. The fifth and sixth transfer rounds are performed in the same manner with the charges stored into the capacitors CS111 and CS112, respectively before transferred to the CS123. Then the switches SC124, SC125 and SC126 are turned on, so the output voltage VOUT1 is the average output of the 2×3=6 transfer rounds. The capacitor CT2 is sampled in the same manner while sampling to the capacitor CT1 and the capacitor CT2 may be performed alternately, so as to facilitate reducing noises.

Operation of the foregoing multi-tier storage structure is described by referring to a two-tier storage structure constructed from N first-tier capacitors and M second-tier for repeatedly sampling the capacitor CT1 for n=N×M rounds. According to the law of charge conservation, the output voltage $$V_{OUT1} = ((V_n + V_{n-1} + \cdots + V_2 + V_1)/M) \times A, \quad [\text{Eq-4}]$$

$$V_{i,i=1 \cdots n} = VDD_i \times \frac{CT1}{CT1 + CT2 + CS1}, \quad [\text{Eq-5}]$$

$$A = \frac{CS1}{N \times CS1 + CS2}, \quad [\text{Eq-6}]$$

where CS1 is the common capacitance of all the first-tier capacitors, and CS2 is the common capacitance of all the second-tier capacitors. By applying the equations Eq-5 and Eq-6 to the equation Eq-4, it is found that the multi-tier storage structure such stores the transferred charges that the input signals and noises are effectively collected for average, thereby reducing the impact of noises. Therefore, by designing the charge-storing circuit 20 as a multi-tier storing circuit, the output voltage is close to the average output voltage obtained by performing transfer rounds in the number equal to the product of the amount of capacitors in all the tiers of the multi-tier structure. In other embodiments, the charge-storing circuit 20 may be designed as a storing circuit with three or more tires in the same way.

Figure 6:
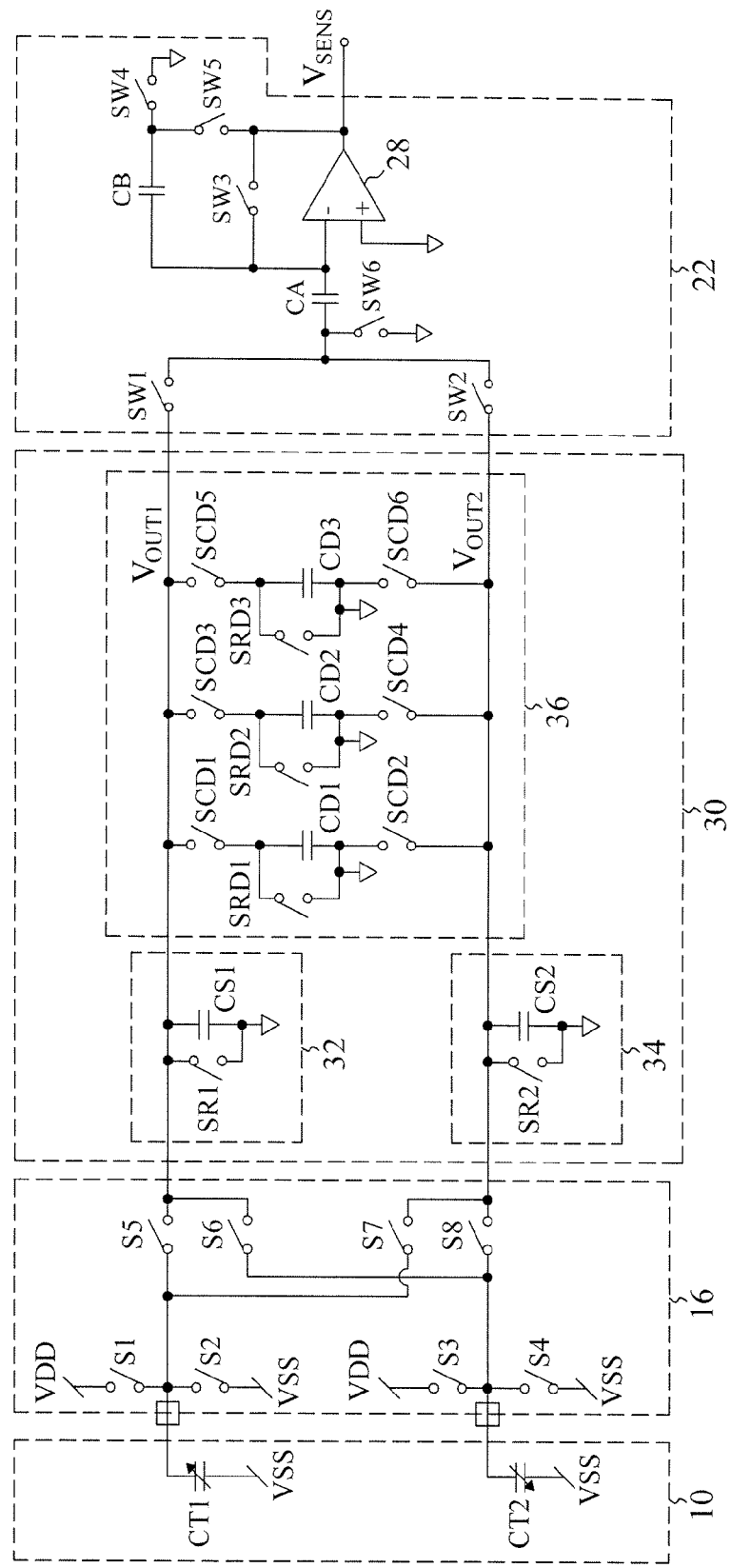
FIG. 6 is a third embodiment of the circuit according to the present invention.

FIG. 6 is a third embodiment of the circuit for sensing a differential capacitance according to the present invention. The circuit includes a switching circuit 16, a charge-storing circuit 30 and an amplifier stage 22. Similar to the embodiment of FIG. 3, the charge-storing circuit 30 also performs oversampling by using plural storing capacitors, but has three storing circuits 32, 34 and 36, wherein the principle of multiple storing capacitors is applied to the storing circuit 36 floated between the storing circuits 32 and 34. In this system, capacitors CS1 and CS2 in the storing circuits 32 and 34 sample capacitors CT1 and CT2, as shown in FIGS. 2A-2D. After the first transfer round, switches SCD1 and SCD2 are turned on, so as to store charges into the capacitor CD1. Then the capacitors CS1 and CS2 are reset, so that the charges similarly sampled in the second transfer round are stored into the capacitor CD2. Again, the capacitors CS1 and CS2 are reset to make the charges sampled in the third transfer round stored into the capacitor CD3. At last, the capacitors CD1-CD3 are connected in parallel and output, so as to achieve even sampling between the inputs and noises. In other embodiments, the storing circuits 32 and 34 also have multiple storing capacitors or a multi-tier storing capacitor, as the storing circuit 24 or 26 shown in FIG. 3 or FIG. 5 so as to further improve the output.

Figure 1:
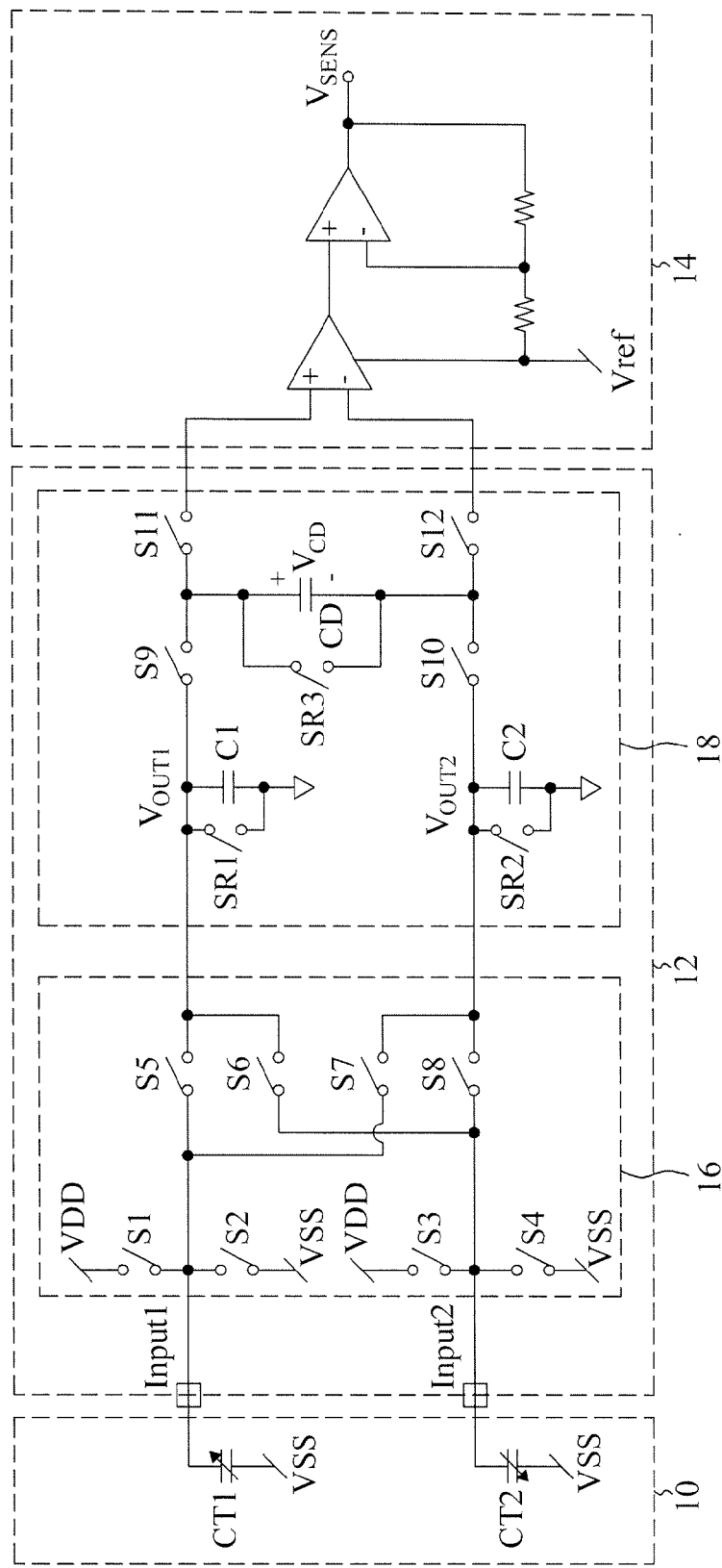
FIG. 1 is a conventional circuit for measuring differential capacitance.
Figure 7:
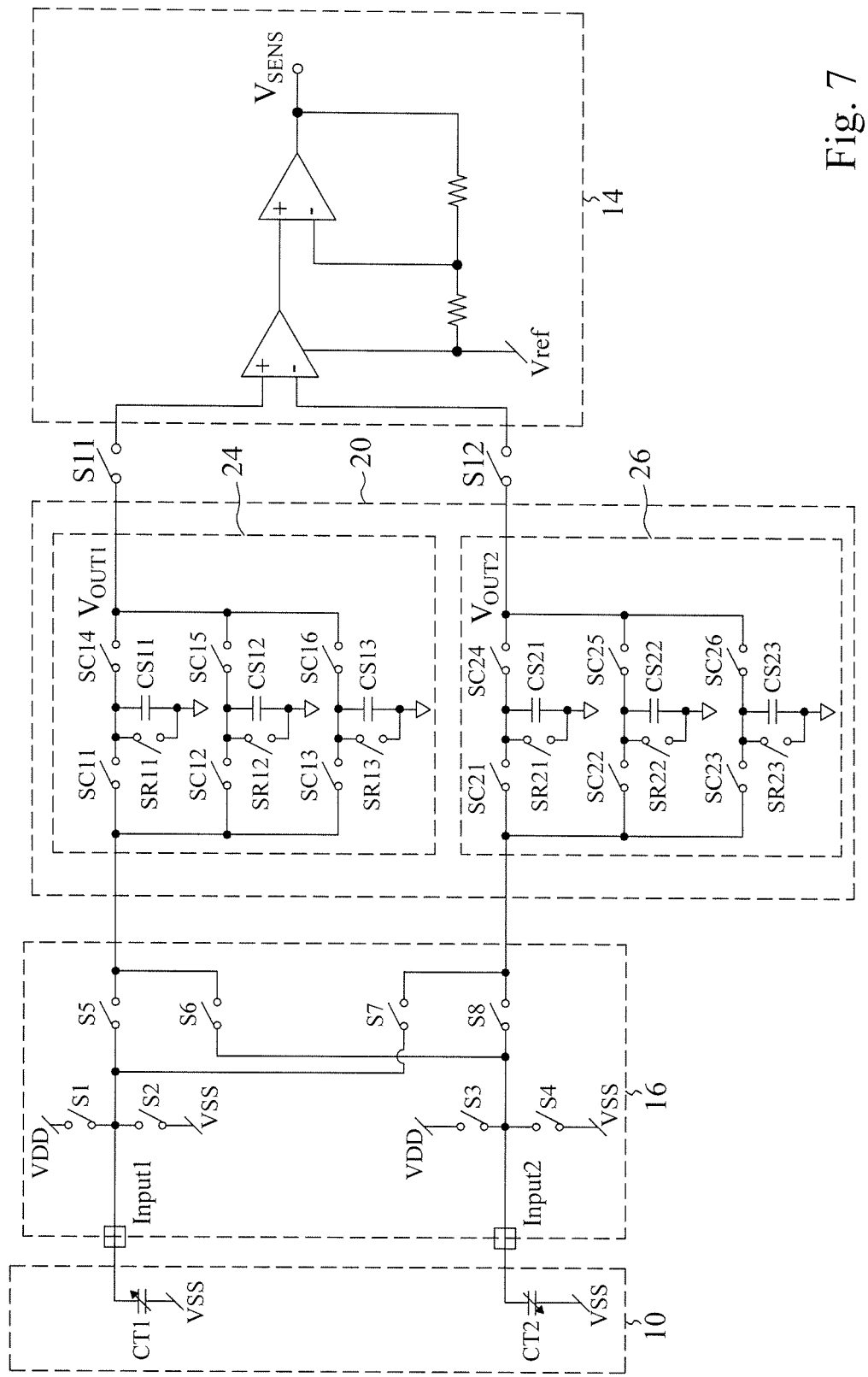
FIG. 7 is a fourth embodiment of the circuit according to the present invention.

The foregoing charge-storing circuits 20 and 30 may use different amplifier stages as the back-end output circuits. As shown in FIG. 7, without considering the non-ideal effects of the operational amplifier in the amplifier stage, the amplifier stage 14 of FIG. 1 may be used as the back-end amplifying and outputting device for presenting the sensing value VSENS.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:
1. A circuit for sensing a differential capacitance, comprising:
a first sensing terminal and a second sensing terminal connected to two terminals of the differential capacitance;

a switching circuit connected to the first and second sensing terminals, for being switched to cause the two terminals of the differential capacitance either to be connected to one of a high-voltage source and a low-voltage source for charge sampling or to perform charge transfer;

a charge-storing circuit coupled to the switching circuit for storing charges transferred by the differential capacitance in response to a switching of the switching circuit, the charge-storing circuit comprising:

a first storing circuit for storing charges sampled at one terminal of the differential capacitance into a first storing capacitor;

a second storing circuit for storing charges sampled at the other terminal of the differential capacitance into a second storing capacitor; and a third storing circuit including a plurality of third storing capacitors, each said third storing capacitor having two terminals connected to the first and second storing circuits, respectively, the third storing circuit sequentially storing charges in the first and second storing circuits in different transfer rounds into a different one of said third storing capacitors, and connecting the plural third storing capacitors in parallel so as to generate a first output voltage and a second output voltage at two terminals thereof; and an amplifier stage generating a sensing value according to a difference between the first and second output voltages;

wherein the first storing capacitor is coupled to the two terminals of the differential capacitance by the switching circuit; and wherein the second storing capacitor is coupled to the two terminals of the differential capacitance by the switching circuit.

2. The circuit of claim 1, wherein the switching circuit comprises:

a first switch pair connected to the first sensing terminal, comprising first upper-bridge and lower-bridge switches connected to the high-voltage source and the low-voltage source, respectively;

a second switch pair connected to the second sensing terminal, comprising second upper-bridge and lower-bridge switches connected to the high-voltage source and the low-voltage source, respectively;

a third switch pair connected to the first storing circuit, so as to make the first storing circuit connected to one or both of the first sensing terminal and the second sensing terminal, thereby allowing the charges to be transferred; and a fourth switch pair connected to the second storing circuit, so as to make the second storing circuit connected to one or both of the first sensing terminal and the second sensing terminal, thereby allowing the charges to be transferred.

3. The circuit of claim 1, wherein the amplifier stage comprises:

an operational amplifier having a positive input terminal connected to a common reference-voltage source;

a first switch for inputting the first output voltage;

a second switch for inputting the second output voltage;

a first sampling capacitor having one terminal connected to a negative input terminal of the operational amplifier and an opposite terminal connected to the first and second switches;

a third switch connected between the negative input terminal and the output terminal of the operational amplifier; and a second sampling capacitor having one terminal connected to the negative input terminal of the operational amplifier and an opposite terminal connected to the common reference-voltage source or the output terminal of the operational amplifier through a fourth switch and a fifth switch.

4. The circuit of claim 1, wherein the amplifier stage is a multistage amplifier.

5. The circuit of claim 4, wherein the multistage amplifier comprises:

a differential amplifier stage generating an amplification signal according to an average of plural said differences; and an impedance conversion stage generating the sensing value according to the amplification signal.

6. A method for sensing a differential capacitance, comprising steps of:

A.) switching a switching circuit to cause two terminals of the differential capacitance either to get connected to one of a high-voltage source and a low-voltage source for charge sampling or to perform charge transfer;

B.) storing charges sampled at one of the two terminals of the differential capacitance into a first storing capacitor;

C.) storing charges sampled at the other terminal of the differential capacitance into a second storing capacitor;

D.) sequentially storing charges in the first and second storing circuits in different transfer rounds into a different one of a plurality of third storing capacitors, and connecting the third storing capacitors in parallel so as to generate a first output voltage and a second output voltage at two terminals of the parallel-connected third storing capacitors; and E.) generating a sensing value according to a difference between the first and second output voltages;

wherein the first storing capacitor is coupled to the two terminals of the differential capacitance by the switching circuit; and wherein the second storing capacitor is coupled to the two terminals of the differential capacitance by the switching circuit.

7. The method of claim 6, wherein the step E comprises steps of:

resetting a first sampling capacitor while storing a non-ideal error of the operational amplifier through a negative input terminal of the operational amplifier into a second sampling capacitor;

using the first sampling capacitor to sample the first output voltage; and using the first sampling capacitor to sample the second output voltage, and making the second sampling capacitor connected between the negative input terminal and an output terminal of the operational amplifier, so as to generate the sensing value related to the difference between the first and second output voltages.

8. The method of claim 6, wherein the step E comprises steps of:

generating an amplification signal according to the first and second output voltages; and generating the sensing value according to the amplification signal.

* * * * *